United States Patent
Shepherd et al.

(10) Patent No.: US 10,344,176 B2
(45) Date of Patent: Jul. 9, 2019

(54) PRINTABLE ELASTOMER MATERIALS

(71) Applicant: Cornell University, Ithaca, NY (US)

(72) Inventors: Robert Shepherd, Brooktondale, NY (US); Sanlin Robinson, Ithaca, NY (US)

(73) Assignee: Cornell University, Ithaca, NY (US)

( * ) Notice: Subject to any disclaimer, the term of this patent is extended or adjusted under 35 U.S.C. 154(b) by 0 days.

(21) Appl. No.: 15/107,770

(22) PCT Filed: Dec. 19, 2014

(86) PCT No.: PCT/US2014/071416
§ 371 (c)(1),
(2) Date: Jun. 23, 2016

(87) PCT Pub. No.: WO2015/100155
PCT Pub. Date: Jul. 2, 2015

(65) Prior Publication Data
US 2016/0319150 A1   Nov. 3, 2016

Related U.S. Application Data

(60) Provisional application No. 61/920,078, filed on Dec. 23, 2013, provisional application No. 62/067,889, filed on Oct. 23, 2014.

(51) Int. Cl.
*C09D 133/26* (2006.01)
*C09D 183/04* (2006.01)
*C09D 5/24* (2006.01)
*C08K 3/16* (2006.01)
*C08K 5/00* (2006.01)
*C08K 5/053* (2006.01)

(52) U.S. Cl.
CPC .............. *C09D 133/26* (2013.01); *C08K 3/16* (2013.01); *C08K 5/0025* (2013.01); *C08K 5/053* (2013.01); *C09D 5/24* (2013.01); *C09D 183/04* (2013.01); *C08L 2312/00* (2013.01)

(58) Field of Classification Search
CPC ....... C09D 133/26; C09D 183/04; C09D 5/24
See application file for complete search history.

(56) References Cited

U.S. PATENT DOCUMENTS

| | | | |
|---|---|---|---|
| 4,564,562 A | 1/1986 | Wong | |
| 2010/0300618 A1 | 12/2010 | Frackmann | |
| 2013/0084449 A1* | 4/2013 | Lewis | A61L 27/16 428/221 |

FOREIGN PATENT DOCUMENTS

EP   1272334 B1   11/2012

* cited by examiner

*Primary Examiner* — Robert D. Harlan
(74) *Attorney, Agent, or Firm* — Hodgson Russ LLP

(57) ABSTRACT

Printable elastomer materials that are conductive or insulating and that may be printed in three dimensions (3D) for use in applications, including for example fabrication of actuators such as dielectric elastomer actuators (DEAs).

15 Claims, 5 Drawing Sheets

PRINTABLE ELASTOMER MATERIALS

CROSS-REFERENCE TO RELATED APPLICATIONS

This application claims the benefit of U.S. Provisional Patent Application No. 61/920,078 filed Dec. 23, 2013 and U.S. Provisional Patent Application No. 62/067,889 filed Oct. 23, 2014, both of which are incorporated by reference.

FIELD OF THE INVENTION

The invention relates generally to polymer materials. More specifically, the invention relates to printable elastomer materials that are conductive or insulating. According to the invention, conductive or insulating elastomer materials may be printed in three dimensions (3D) and be used to fabricate dielectric elastomer actuators (DEAs) including, for example, those that function like stretchable capacitors.

BACKGROUND OF THE INVENTION

Dielectric elastomer actuators (DEAs) are configured to transform electric energy directly into mechanical work. DEAs have the potential to replace other types of actuators including, for example, pneumatic actuators, electromagnetic actuators, and piezo actuators.

Certain types of dielectric elastomer actuators (DEAs) are polymeric capacitors capable of converting voltage inputs into mechanical actuation, as well as pressure stimulus into detectable electrical signal. As shown in FIG. 1A, a DEA 20 may essentially act as an electromechanical transducer that consists of a highly stretchable dielectric layer 25. The stretchable dielectric layer 25 is located between two compliant electrodes 27, 29. As shown in FIG. 1B, when an electric field is applied across the compliant electrodes 27, 29—one anode electrode and one cathode electrode—they become oppositely charged and attracted to one another, which induces a mechanical strain. Specifically, the DEA 20 expands in area and contracts in thickness as shown in FIG. 1B.

Research with respect to DEAs has been primarily focused on improving the architecture of the DEAs and enhancing material properties. For example, enhancing material properties of the stretchable conductor and dielectric material may result in greater elongations, application of greater forces, improved electrical/optical properties, and reliable operation. DEA research has resulted in many improvements including transparent and stretchable audio speakers, heel-strike dielectric energy generators (DEGs) that produce approximately 2 Watts (W) per shoe, wave energy generators that produced a peak power of 1.5 W and average of 0.25 W in low wave conditions, strain sensors that are also actuators, and even that act as digital logic and soft diodes for energy generators.

Although efforts have been made to produce DEAs with improved electrical and optical properties, strength, and improved reliability, known DEAs are typically limited to two dimensional (2D) devices and are often assembled manually. The inability to fabricate truly three dimensional (3D) DEAs without great difficulty limits DEA technology.

Thus, there is a need for 3D printable elastomer materials that are conductive or insulating which may be used to fabricate actuators. The invention satisfies this need.

SUMMARY OF THE INVENTION

Certain embodiments of the present invention include photopolymerizable materials to produce machine generated three-dimensional printable actuators. Specifically printable elastomer materials according to the invention may be used to fabricate electroactive polymers including stretchable electrode and dielectric materials.

Conductive and insulating elastomer materials according to the invention may have applications in the fields of haptic feedback, pumps, valves, robotics, flexible sensors, biomedical devices, power generation, active vibration control structures, optional positioners, sensing of force and pressure, active Braille displays, speakers, deformable surfaces for optics and aerospace, and energy harvesting, to name a few.

More specifically, conductive and insulating elastomer materials according to the invention may be used for energy harvesting by being incorporated into smart-sidewalks, brake pads, garments, and shoes. With respect to biomedical devices, the conductive and insulating elastomer materials may be used for prosthetics or artificial muscles, for example, to assist the disabled and elderly with independent mobility.

The fabrication of 3D printable elastomer materials provides the capability of producing sophisticated and useful geometries previously unattainable. By 3D printing elastomer materials, more intricate structures may be printed such as stretchable capacitors that generate power. For example, to generate power from a stretchable capacitor, a low voltage is applied to charged surfaces when an electroactive polymer is stretched; when the strain is released, the charges accumulate to a high voltage that is pumped through a diode and stored.

According to one embodiment of the invention, a printable elastomer material is in the form of a "conductive ink" which can be used in creating a 3D printed object that conducts electricity. As one example, conductive ink can be used in the assembly of DEAs. The quality of the compliant elastomer material is based on several material properties related to: stretch-ability, stress-strain response, sheet resistance.

One advantage of the invention is that printable conductive and insulating elastomer materials have been developed for use in 3D printing. Devices can be 3D printed such as insulating dielectric materials as well as compliant electrode materials with low sheet resistance, high stretch-ability, and transparency.

Another advantage of the invention is that printable elastomer materials may be transparent and further fail to evaporate solvent over time in ambient conditions.

Another advantage of the invention is that printable elastomer materials have high conductivity, high toughness and extensibility, and also tunable elastic moduli including when the materials are photo-patterned.

An additional advantage of the invention is that dielectric strength of a stretchable insulator may be increased by creating blends of silicones—both high and low molecular weights (MW)—so that high molecular weight silicones align during printing and the crosslinking of the low molecular weight locks in the strain of the high molecular weight system.

By synthesizing and formulating 3D printable polymer materials, designs for soft energy generators, actuators, sensors, and logic devices may be fully explored.

The invention and its attributes and advantages will be further understood and appreciated with reference to the accompanying drawings.

BRIEF DESCRIPTION OF THE DRAWINGS

The preferred embodiments of the invention will be described in conjunction with the appended drawings provided to illustrate and not to the limit the invention, where like designations denote like elements, and in which.

DETAILED DESCRIPTION

Figure 1A:
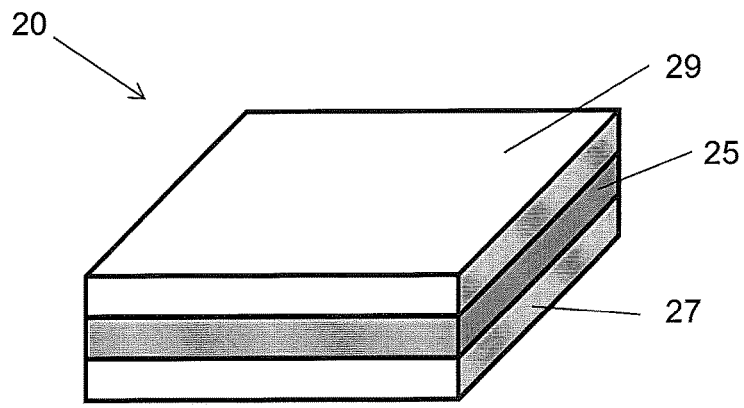
FIG. 1A illustrates a perspective view of an elastomer actuator.
Figure 1B:
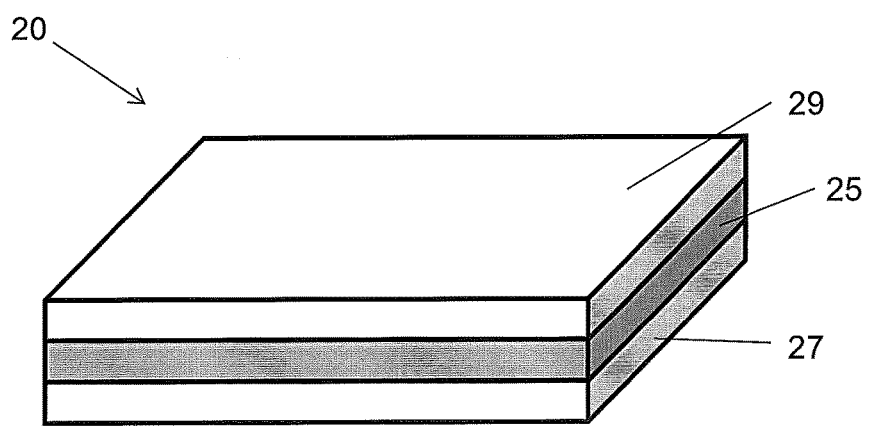
FIG. 1B illustrates a perspective view of the dielectric elastomer actuator according to FIG. 1A under application of an electric field.
Figure 2:
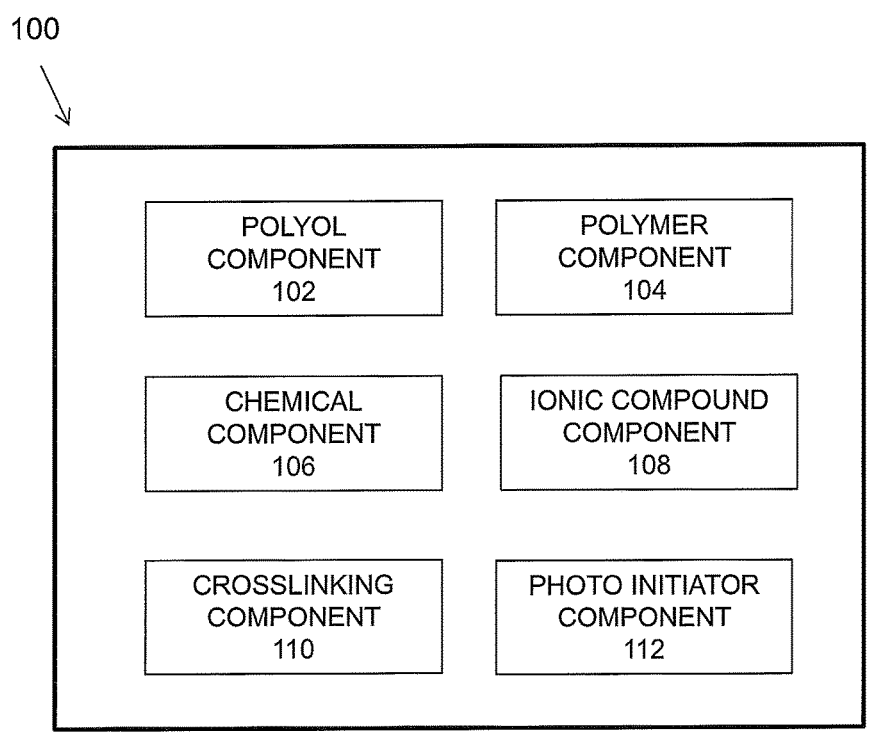
FIG. 2 is a block diagram illustrating the components of a printable conductive elastomer material according to one embodiment of the invention.

FIG. 2 is a block diagram illustrating the components of a printable conductive elastomer material according to one embodiment of the invention. In the embodiment according to FIG. 2, the printable conductive elastomer 100 is a conducting electrode material. The printable conductive elastomer 100 includes one or more selected from the group comprising: a polyol component 102, a polymer component 104, a chemical component 106, an ionic compound component 108, and a photo initiator component 112.

The polyol component 102 is any alcohol containing multiple hydroxyl groups and includes, for example, as glycerin, pentaerythritol, ethylene glycol, polyethylene glycol, polypropylene glycol, and glycerol.

The polymer component 104 is composed of many repeated subunits and may be either synthetic or natural. In one embodiment, the polymer component 104 is polyacrylamide, a polymer formed from acrylamide subunits.

The chemical component 106 is any chemical substance consisting of two or more different chemical elements. In one embodiment according to the invention, the chemical component 106 is acrylamide.

The ionic compound component 108 is any chemical compound in which ions are held together in a structure by ionic bonds. Examples of ionic compound components 108 include sodium chloride and 1-Decyl-3-methylimidazolium Chloride.

The crosslinking agent component 110 joins two or more molecules by a covalent bond. More specifically, the crosslinking agent component 110 forms chemical links between molecular chains to form a three-dimensional network of connected molecules. In one embodiment, the crosslinking agent component 110 is N,N'-Methylenebisacrylamide.

The photo initiator component 112 promotes a polymerization reaction and may include, for example, Irgacure® 1173 (also referred to herein as "2-hydroxy-2-methyl-1-phenyl-propan-1-one") and Darocur® 1173.

Figure 3:
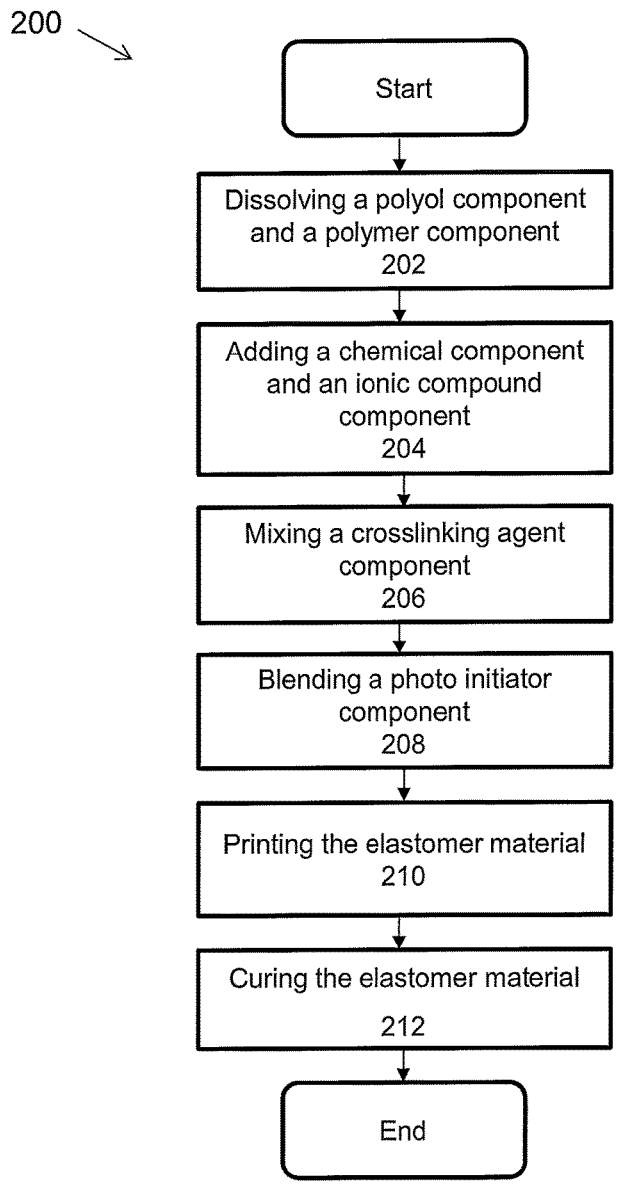
FIG. 3 is a flow diagram of the method steps for creating the printable conductive elastomer material according to FIG. 2.

FIG. 3 is a flow diagram 200 of the method steps for creating a printable conductive elastomer material according to the embodiment of FIG. 2. The printable conductive elastomer material is formed by first dissolving a polyol component and a polymer component as shown in step 202. More specifically, 1.15 mL glycerol (Sigma Aldrich g9012) and 166 mg polyacrylamide 4-5 million MW (PAAM, Sigma 92560) is dissolved in 5 mL of deionzied water (Sigma Aldrich 38796) with a magnetic stir bar until the glycerol and polyacrylamide are fully dissolved to obtain a solution. It is contemplated that the ratio of water to glycerol can be adjusted from low glycerol content to almost entirely glycerol to reduce water loss during printing.

Next, as shown in step 204, a chemical component and an ionic compound component are added to the solution. In one embodiment, 833 mg acrylamide (AAM, Sigma A8889) and 833 mg sodium chloride (Sigma s7653) are added.

At step 206 a crosslinking agent component is added to the solution, specifically, 8.33 mg N, N'methylenebisacrylamide (MBA, Acros 164790250) is added to the solution and stirred until fully dissolved.

A photo initiator component is blended into the solution at step 208 to obtain the conductive elastomer material. In one embodiment, the photo initiator component is 23 uL of Irgacure® 1173 (BASF). However, it is contemplated the photo initiator component may be Darocur® 1173 (BASF).

The printable conductive elastomer may be printed as shown in step 210 using a three-dimensional printer. At step 212, the conductive elastomer material may be cured using an ultraviolet light source to obtain an object.

It is contemplated that a conducting elastomer may be provided without requiring each and every component as illustrated in FIG. 2. As an example, a conductive hydrogel may be formulated based on 2-Hydroxyethyl methacrylate and 1-Decyl-3-methylimidazolium chloride. Specifically, the conductive hydrogel may be formulated by mixing equal parts of 2-Hydroxyethyl methacrylate monomer (HEMA, Sigma 128635) and glycerol. After this was well blended, 2 wt % 1-Decyl-3-methylimidazolium Chloride (Sigma 690597), 0.5 wt % Ethylene glycol dimethacrylate (Sigma 335681), and 0.5 wt % Irgacure 1173 is added to the solution and vigorously stirred until all constituents are dissolved. The solution may be casted onto a sheet of acrylic and photo polymerized using an ultraviolet (UV) light source. It is further contemplated that the Young's modulus of the conductive hydrogel may be tuned by adjusting the concentration of the crosslinking component. the viscosity of the conductive hydrogel may be tuned using high MW poly(2-hydroxyethyl methacrylate) in order to achieve 3D printability.

Figure 4:
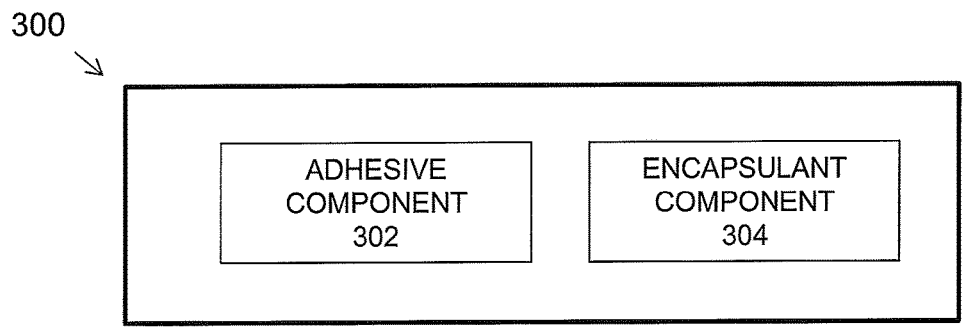
FIG. 4 is a block diagram illustrating the components of a printable insulating elastomer material according to another embodiment of the invention.

FIG. 4 is a block diagram illustrating the components of a printable insulating elastomer material 300 according to another embodiment of the invention. In the embodiment according to FIG. 4, the printable elastomer material 300 is an insulating dielectric material.

Figure 5:
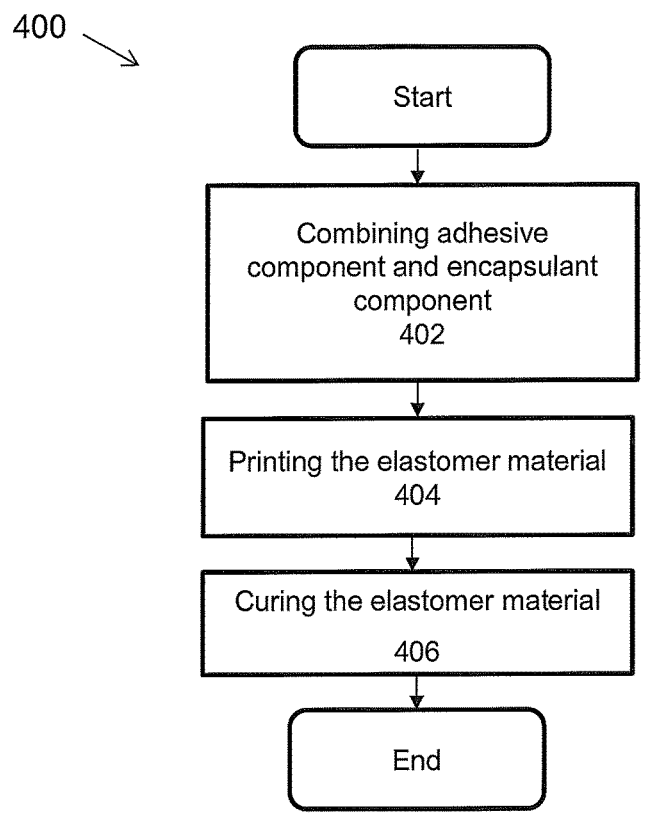
FIG. 5 is a flow diagram of the method steps for creating a printable insulating elastomer material according to FIG. 4.

The printable insulating elastomer material 300 includes one or more selected from the group comprising: an adhesive component 302 and an encapsulant component 304. In one embodiment, the adhesive component 302 is Loctite® 5039 Nuva-Sil Silicone Light Cure Adhesive/Sealant and the encapsulant component 304 is Dow Corning® X3-6211 Encapsulant. As shown in the flow chart 400 of FIG. 5, the adhesive component and encapsulant component are combined at step 402. Specifically, 60 wt % Loctite® 5039 Nuva-Sil Silicone Light Cure Adhesive/Sealant is combined with 40 wt % Dow Corning® X3-6211 Encapsulant. Similar to the conductive elastomer material as described in reference to FIG. 2, the insulating elastomer material may be printed as shown in step 404 using a three-dimensional printer as well as cured using an ultraviolet light source to obtain an object as shown in step 406.

Figure 6:
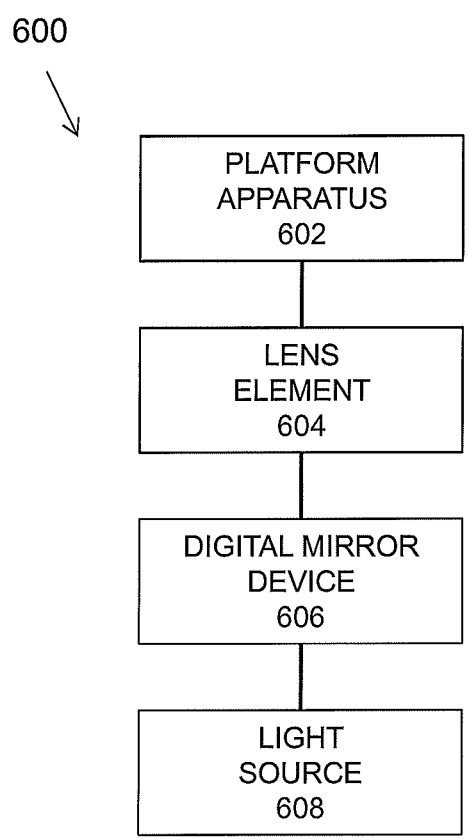
FIG. 6 is a block diagram of a digital mask projection stereolithography system according to one embodiment of the invention.

FIG. 6 is a block diagram of a digital mask projection stereolithography system 600 that may be used to create an object from one or more of the printable elastomer materials according to the invention. The stereolithography system 600 includes a platform apparatus 602 movable in three dimensions (x, y, z), a lens element 604, a digital mirror device 606, and a light source 608.

The platform apparatus 602 includes a syringe for dispensing the printable elastomer material from a pressure dispensing system. In one embodiment, a printable elastomer material is loaded into a syringe with a dispensing tip. The tip used may include stainless steel dispensing needles, which range in diameter from 100 to 330 micrometers. It is contemplated that print heads shield most of the syringe from an ultraviolent light source 608, but a tip cover may be used to block rays from reaching and pre-photopolymerizing the printable elastomer material through the clear tip hub. A pressure of 3-6 pounds per square inch (psi) is applied to get the printable elastomer material to flow out of the nozzle, where pressure applied depends on the size of tip gauge used.

The digital mirror device 606 includes an array of mirrors that move according to the object to be created. Light from the light source 608 hits the mirrors and passes through the lens element 604 and onto the printable elastomer material dispensed on the platform apparatus 602. Light from the light source 608 hits only those mirrors which correspond to the object to be created. The light from the ultraviolet light source 608 cures the printable elastomer material to form the object.

While the disclosure is susceptible to various modifications and alternative forms, specific exemplary embodiments of the invention have been shown by way of example in the drawings and have been described in detail. It should be understood, however, that there is no intent to limit the disclosure to the particular embodiments disclosed, but on the contrary, the intention is to cover all modifications, equivalents, and alternatives falling within the scope of the disclosure as defined by the appended claims.

The invention claimed is:

1. A printable conductive elastomer material, comprising:
   a polyol component;
   a polymer component;
   a chemical component;
   an ionic compound component;
   a crosslinking agent component; and
   a photo initiator component,
wherein the printable conductive elastomer material is conductive.

2. The printable conductive elastomer material according to claim 1, wherein the polyol component is glycerol.

3. The printable conductive elastomer material according to claim 1, wherein the polymer component is polyacrylamide.

4. The printable conductive elastomer material according to claim 1, wherein the chemical component is acrylamide.

5. The printable conductive elastomer material according to claim 1, wherein the ionic compound component is sodium chloride.

6. The printable conductive elastomer material according to claim 1, wherein the crosslinking agent component is N,N'-Methylenebisacrylamide.

7. The printable conductive elastomer material according to claim 1, wherein the photo initiator component is 2-hydroxy-2-methyl-1-phenyl-propan-1-one.

8. A method for creating a conductive elastomer material, comprising the steps of:
   dissolving a polyol component and a polymer component in water to obtain a first solution;
   adding to the first solution a chemical component and an ionic compound component to obtain a second solution;
   mixing with the second solution a crosslinking agent component to obtain a mixture; and
   blending into the mixture a photo initiator component to obtain the conductive elastomer material.

9. The method for creating a conductive elastomer material according to claim 8, further comprising the steps of:
   printing the conductive elastomer material using a three-dimensional printer; and
   curing the conductive elastomer material using an ultraviolet light source to obtain an object.

10. The method for creating a conductive elastomer material according to claim 8, wherein the polyol component is glycerol.

11. The method for creating a conductive elastomer material according to claim 8, wherein the polymer component is polyacrylamide.

12. The method for creating a conductive elastomer material according to claim 8, wherein the chemical component is acrylamide.

13. The method for creating a conductive elastomer material according to claim 8, wherein the ionic compound component is sodium chloride.

14. The method for creating a conductive elastomer material according to claim 8, wherein the crosslinking agent component is N,N'-Methylenebisacrylamide.

15. The method for creating a conductive elastomer material according to claim 8, wherein the photo initiator component is 2-hydroxy-2-methyl-1-phenyl-propan-1-one.

\* \* \* \* \*